United States Patent [19]
Jacobine et al.

[11] Patent Number: 5,167,882
[45] Date of Patent: Dec. 1, 1992

[54] STEREOLITHOGRAPHY METHOD

[75] Inventors: Anthony F. Jacobine, Meriden, Conn.; Margaret A. Rakas, Longmeadow, Mass.; David M. Glaser, New Britain, Conn.

[73] Assignee: Loctite Corporation, Newington, Conn.

[21] Appl. No.: 651,271

[22] Filed: Feb. 5, 1991

Related U.S. Application Data

[63] Continuation-in-part of Ser. No. 632,391, Dec. 21, 1990, abandoned.

[51] Int. Cl.$^5$ .................... B29C 35/08; B29C 41/02
[52] U.S. Cl. .................... 264/22; 156/273.3; 156/273.5; 156/275.5; 156/307.1; 264/308; 427/581; 427/586; 522/24; 522/64; 522/66; 522/99; 522/167; 522/168; 522/169; 522/173; 522/180; 522/910; 528/25; 528/26; 528/30; 528/128; 528/173; 528/205; 528/344; 528/360; 528/361; 528/364; 528/376
[58] Field of Search .............. 264/22, 308; 156/273.3, 156/273.5, 275.5, 307.1; 427/43.1, 53.1, 54.1; 250/492.1; 522/24, 64, 66, 99, 167, 168, 169, 173, 180, 910; 526/281; 528/25, 26, 30, 128, 173, 205, 344, 360, 361, 364, 376

[56] References Cited

U.S. PATENT DOCUMENTS

| | | | |
|---|---|---|---|
| 3,445,419 | 5/1969 | Vanderlinde | 524/863 |
| 3,661,744 | 5/1972 | Kehr et al. | 428/419 |
| 4,119,617 | 10/1978 | Hanyuda et al. | 528/360 |
| 4,289,867 | 9/1981 | Martin | 528/12 |
| 4,416,826 | 11/1983 | Neckers | 560/302 |
| 4,575,330 | 5/1986 | Hull | 425/174.4 |
| 4,604,295 | 8/1986 | Humphreys | 427/54.1 |
| 4,752,498 | 6/1988 | Fudim | 427/54.1 |
| 4,801,477 | 1/1989 | Fudim | 427/54.1 |
| 4,808,638 | 2/1989 | Steinkraus et al. | 522/24 |
| 4,929,402 | 5/1990 | Hull | 264/22 |

OTHER PUBLICATIONS

Murphy et al., "Reduced Distortion in Optical Free Form Fabrications with UV Lasers" Radiation Curing, Feb.-May 1989, pp. 3-7.
Chemical Week, Sep. 9, 1987, pp. 24-25.
Jacobine et al., Proceedings of ACS Division of Polymeric Materials: Science and Engineering, vol. 60, pp. 211-216 (1989).
Jacobine et al., "Photoinitiated Cross-linking of Norbornene Resins with Multifunctional Thiols", Chapter 13 of Radiation Curing of Polymeric Materials, ACS Symposium Series #417, American Chemical Society (1990).
D. C. Neckers, "An Introduction to Stereolithography", Center for Photochemical Sciences, The Spectrum, vol. 2, Issue 4 (Winter 1989) pp. 5-10.

Primary Examiner—Leo B. Tentoni

[57] ABSTRACT

An improved stereolithography method for building a three-dimensional article including the steps of patternwise curing successive layers of a bath of curable liquid resin formulation until the article has been completely built up, removing the article from the liquid resin bath and then post-curing the article, wherein the liquid resin is a "thiol/nene" formulation including:

(a) a first compound having a plurality of norbornene groups thereon;
(b) a second compound having a plurality of thiol groups therein; and
(c) a free radical photoinitiator, the total functionality of the formulation being greater than 4.

11 Claims, 1 Drawing Sheet ns in stereolithography applications by providing faster cure, low shrinkage and good dimensional stability after post-curing. The formulations also appear to have very low toxicity. Particularly preferred are resin systems based upon norbornene carboxylate esters of alkane polyols, alkoxylated bisphenol-A diols or mixtures thereof, and polyol esters of α or β-mercaptoacids. Such materials allow for the provision of a wide variety of mechanical and Tg properties in the post-cured product. For instance, the acrylic formulations commercially formulated for stereolithography prior to the invention hereof produced highly brittle post-cured products which were highly susceptible to breakage when manufacturing thin walled articles. As described below, however, the thiol/nene formulations of the invention can readily be formulated to provide tough non-brittle post-cured properties while retaining faster cure speed than the prior brittle acrylic resins.

STEREOLITHOGRAPHY METHOD

CROSS-REFERENCE TO RELATED APPLICATION

This application is a continuation-in-part of application Ser. No. 07/632,391, filed Dec. 21, 1990, now abandoned.

BACKGROUND

The term "stereolithography" denotes a process for the production of complex solid 3-dimensional objects by curing successive thin layers of photocurable liquid composition using a computer controlled laser to affect patterned photocuring of the liquid surface. The technique is described in detail in Murphy, et al, "Reduced Distortion in Optical Free Form Fabrications with UV Lasers", Radiation Curing, Feb-May 1989, pp. 3-7; Chemical Week, Sep. 9, 1987, pp. 24-25; and in U.S. Pat. Nos. 4,575,330; 4,801,447; 4,929,402; and 4,752,498, all incorporated herein by reference.

Heretofore it has been conventional to use various acrylic ester monomers as the photocurable liquids for stereolithography because of their fast UV response time and lack of curing outside the irradiation boundary. However, acrylic esters have very high shrinkage upon curing which has severely restricted to practical utility of the stereolithography technique. As successive layers are built up, complex objects are distorted by shrinkage differences between portions of the object.

While photocurable resin systems having lower shrinkage, such as photocurable epoxy formulations, are well known such systems were generally considered to have lower UV response and/or greater potential for continued curing outside the irradiation boundaries than acrylic monomers. Consequently, such systems have heretofore been rejected as undesirable for stereolithography applications.

In U.S. Pat. No. 4,808,638 there are described photocurable thiolene compositions comprising a norbornene functional resin, a polythiol and a free radical photoinitiator. Further description of this system may be found in Jacobine et al, *Proceedings of ACS Division of Polymeric Materials: Science and Engineering*, Vol. 60, pp. 211-216 (1989).

SUMMARY OF THE INVENTION

The invention herein is a new method for stereolithography which replaces conventional acrylic resins with a curable norbornene based thiol-ene resin system (hereinafter "thiol/nene") of the type disclosed in U.S. Pat. No. 4,808,638. More particularly, the invention is an improved stereolithography method for building a three-dimensional article comprising the steps of patternwise curing successive layers of a bath of curable liquid resin formulation until the article has been completely built up, removing the article from the liquid resin bath and then postcuring the article, wherein the liquid resin is a thiol/nene formulation comprising:

(a) a first compound having a plurality of norbornene groups thereon;
(b) a second compound having a plurality of thiol groups therein; and
(c) a free radical photoinitiator, the total functionality of the formulation being greater than 4.

The inventors have discovered that thiol/nene formulations provide significant advantages over acrylic

DETAILED DESCRIPTION OF THE INVENTION

Figure 1:
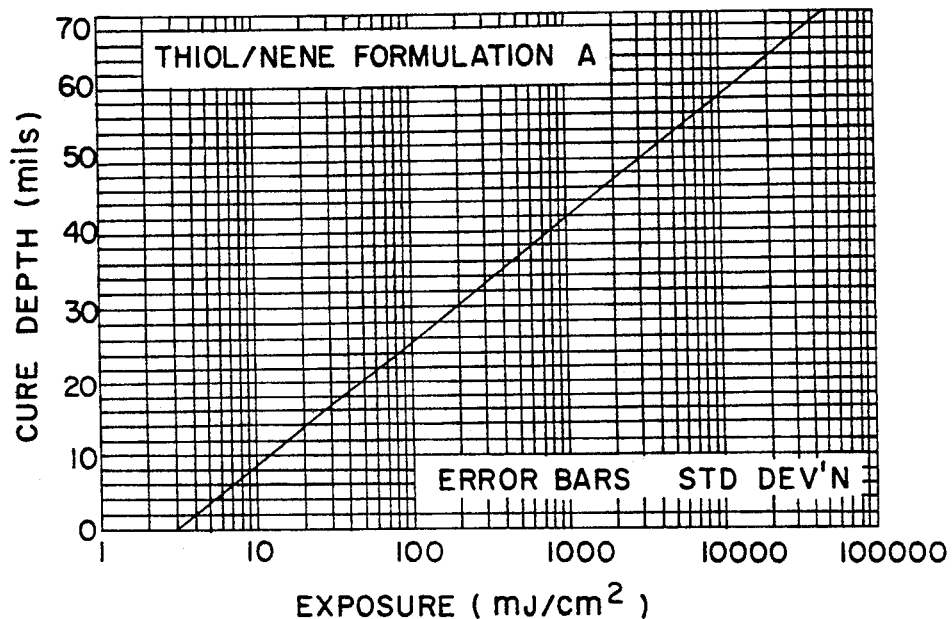
FIGS. 1 and 2 are UV response curves showing dosage/cure depth relationships determined from railroad tie data obtained from examples A and B, respectively.

The typical stereolithography process to which the invention pertains involves the steps of building a three-dimensional object by patternwise curing successive thin layer sections of the object in a liquid resin bath.

In most conventional processes the object is built by successive UV laser tracings on the surface of a curable liquid over a submerged platform which is incrementally lowered after each layer is built up. As the platform is lowered, liquid resin flows over the previous layer providing a smooth liquid surface on which the laser traces the next layer. When the article is complete it can be removed from the bath and drained or cleaned but the resin in the object is only partially cured. This is called the "green" stage. To stabilize and strengthen the article it is conventionally subjected to post-curing. Post-curing is usually accomplished by subjecting the entire object to extended irradiation under UV floodlamps although other techniques, such as oven curing, are also described in the literature. Commercial apparatus for performing such a stereolithography process are available, for instance from 3D Systems, Inc.

The plural norbornene functional compounds useful in the invention are known from U.S. Pat. No. 4,808,638, incorporated herein by reference, and have recently also been described in Jacobine et al, "Photoinitiated Cross-linking of Norbornene Resins with Multifunctional Thiols", Chapter 13 of Radiation Curing of Polymeric Materials, ACS Symposium Series #417, American Chemical Society, 1990, also incorporated herein by reference. Further examples of suitable norbornene functional resins are given in synthesis examples 1-19, below. Particularly preferred norbornene compounds are norbornene carboxylate esters of polyols such as 1,6-hexanediol, trimethylolpropane, ethoxylated bisphenol A, and mixtures thereof.

The polythiol component of the inventive compositions may be any compound having two or more thiol groups per molecule. Suitable polythiols are described in U.S. Pat. No. 3,661,744 at Col. 8, line 76-Col. 9, line 46, in U.S. Pat. No. 4,119,617, Col. 7, lines 40-57, U.S. Pat. No. 3,445,419 and U.S. Pat. No. 4,289,867. Especially preferred are polythiols obtained by esterification of a polyol with an α or β-mercaptocarboxylic acid such as thioglycolic acid, or β-mercaptopropionic acid. Particularly preferred polythiols are pentaerythritol tetramercaptoacetate and pentaerythritol tetrakis-β-mercaptopropionate (PETMP).

The ratio of the polyene to the polythiol component can be varied widely. Generally it is preferred that the ratio of thiol to ene groups be between 0.7:1 and 1.3:1 but ratios outside this range may occasionally be usefully employed without departing from the invention hereof.

While a curable composition using norbornene functional compounds of the invention may include both difunctional norbornenyl compounds and difunctional thiol compounds, it will be understood that at least a portion of at least one of these components should contain more than two functional groups per molecule to produce a crosslinked product when cured. That is, the total of the average number of norbornene groups per molecule of norbornene functional compound and the average number of coreactive thiol groups per molecule of the thiol functional compound should be greater than 4 when a crosslinked cured product is desired. This total is referred to as the "total reactive functionality" of the composition.

The initiator used in the curable thiolene formulations is suitably a free radical photoinitiator. Examples of free radical photoinitiators include benzoin and substituted benzoin compounds, benzophenone, Michler's ketone, dialkoxybenzophenones, dialkoxyacetophenones, peroxyesters described in U.S. Pat. Nos. 4,616,826 and 4,604,295, etc. The photoinitiator is employed in an amount effective for initiating cure of the formulation, typically 0.5–5%.

The formulations also preferably include a stabilizer. Preferred stabilizers are described in U.S. Ser. No. 07/612,759, claiming priority of Irish application 3638/89 filed Nov. 13, 1989, incorporated herein by reference. Such stabilizers are non-acidic nitroso compounds, particularly N-nitrosohydroxylamines and salts thereof. A suitable such compound is the aluminum salt of N-nitrosophenylhydroxylamine which may be usefully employed at levels between about 100 ppm and 2%, preferably 500–10,000 ppm.

The thiol/nene formulations, even with stabilization, are quite sensitive to fluorescent light and must be kept in the dark to remain stable for more than a few days. If storage for periods of more than a few months is necessary, separating nene and thiol compounds in a two-part formulation may be required.

It has recently been discovered that triiodide and other polyiodides are useful shelf-life stabilizers for thiol-nene formulations. Use of such stabilizers has not yet been investigated in stereolithographic applications. If they do not significantly reduce UV response, a matter which can be readily determined by a skilled artisan, their inclusion in the thiol-nene formulations used in the invention is highly recommended. Suitable polyiodide stabilizers may be $KI/I_2$ (1:2 parts by wt) solutions in water at levels providing 10–2,000 ppm $I_2$, preferably 30–800 ppm $I_2$. An aqueous $KI/I_2$ solution in which the concentration of $I_2$ is 1N is a suitable such solution. Compatible organic solvents such as lower alcohols may also be employed to introduce a polyiodide stabilizer into the formulation. The $Ki/I_2$ solution is suitably added to either the norbornene resin or the thiol resin prior to mixing.

The usefulness of the thiol/nene system in stereolithography applications is surprising in view of the difference in cure mechanism between acrylic and thiolene systems. The thiol-ene mechanism is essentially a step-growth chain transfer mechanism which was thought much more amenable to propagation of polymerization reactions beyond irradiation boundaries. Consequently it was thought that poor line resolution might result when the resin was irradiated with a UV laser. Polymer propagation outside the laser path, resulting in, sometimes severe, smearing of part lines or growth of polymer "blobs" beyond the laser path has been observed with the thiol/nene system at cure depths of greater than about 40 mils but this is not a significant problem since normal incremental cure depths are about 5–20 mils, most typically 10–12 mils.

The invention may be illustrated by the following nonlimiting examples.

EXAMPLE 1

Synthesis of endo, exo-Norborn-2-ene-5-carbonyl Chloride, I

In a 1000 ml four-necked, round-bottomed flask that was equipped with a magnetic stirrer, an efficient condenser, a constant pressure addition funnel, and a thermometer that was connected to a Thermowatch ™ thermostatic controller was stirred acryloyl chloride (271.8 g, 3.00 mol) under a nitrogen atmosphere. Freshly cracked and distilled cyclopentadiene monomer (198.2 g, 3.00 mol) was added at such a rate that the reaction temperature did not exceed 80°–90° C. at any time during the addition. When the addition was completed the reaction was stirred for an additional three hours. Residual starting materials were removed using a water aspirator and the crude reaction mixture was then distilled in vacuo to give the purified product (b.p. 66°–70° C. at 4 mm Hg).

EXAMPLE 2

Synthesis of endo, exo-Norborn-2-ene-5-carbonyl Chloride, II

In a 1000 ml four-necked, round-bottomed flask that was equipped with a magnetic stirrer, an efficient condenser, a constant pressure addition funnel, and a thermometer that was connected to a Thermowatch ™ thermostatic controller was stirred freshly distilled methacryloyl chloride (250 g, 2.391 mol, Aldrich Chemical Co.) under a nitrogen atmosphere. Freshly cracked and distilled cyclopentadiene monomer (173.62 g, 2.63 mol) was added at such a rate that the reaction temperature did not exceed 80°–90° C. at any time during the addition. When the addition was completed the reaction was stirred for an additional three hours. Residual starting materials were removed using a water aspirator and the crude reaction mixture was then distilled in vacuo to give the purified product (b.p. 74°–76° C. at 4–7 mm Hg).

EXAMPLE 3

Synthesis of endo, exo-Norborn-5-ene-5-methyl endo, exo-Norborn-2-ene-5-Carboxylate, III Norbornenecarboxaldehyde (100 g, 8.18 mol, Aldrich Chemical Co.) was added rapidly to aluminum isopropoxide (20.0 g) in a 2000 ml round-bottomed, three-necked flask equipped with a constant pressure addition funnel, a thermometer, and an efficient condenser which was under a nitrogen atmosphere. Provision was made for external cooling and a reaction temperature of 50° C. was maintained by external cooling and moderating the rate of addition of the aldehyde. The reaction mixture was aged at 60° C. for two hours and then cooled. The reaction mixture was then distilled with 100 ml of hexane, washed with water (3×400 ml) filtered to remove solid particulate matter and concentrated on a rotary evaporator. The crude reaction mixture was then distilled in vacuo to give the purified product (b.p. 125°-130° C. at 2.5-4.0 mm Hg).

EXAMPLE 4

Synthesis of endo, exo-Norborn-2-ene-5-isocyanate, IV

Sodium azide (228.47 g, 3,51 mol in 250 ml deionized water) was added dropwise to a stirred solution of norborn-2-ene-5-carbonyl chloride (500 g., 3.19 mol) and tetra-(n-butyl)ammonium bromide (2.5 g, 0.0077 mol) in dichloromethane (1000 ml) in a 4 liter beaker which had been cooled to 5°-10° C. and maintained at this temperature throughout the reaction. After the addition was completed, the organic layer was separated and dried over anhydrous sodium sulfate and filtered. The filtered solution was then added dropwise to a 2 L round-bottomed flask that was set up for distillation containing benzene (500 ml) maintained at 70° C. Dichloromethane was removed by distillation (overhead temperature 50°-55° C.) and collected. After the addition was completed the temperature of the reaction mixture was maintained at 70° C. for two hours. The reaction mixture was then concentrated on a rotary evaporator and distilled in vacuo. The purified product was collected as a fraction b.p. 60°-65° C. at 115 mm Hg.

EXAMPLE 5

Synthesis of endo, exo-2-(Norborn-5-ene-5)-4,4-dimethyloxazoline-5-one Norbornene Azlactone (NAz), V In a 1000 ml four-necked, round-bottomed flask that was equipped with a magnetic stirrer, an efficient condenser, a constant pressure addition funnel, and a thermometer was stirred 2-vinyl-4,4-dimethyloxazoline-5-one (501.66 g, 3.61 mol, SNPE, Inc., Princeton, N.J.) under a nitrogen atmosphere. The solution was thermostated at 40° C. by means of a Thermowatch TM Controller and freshly cracked and distilled cyclopentadiene monomer (262.3 g, 3.97 mol) was added at such a rate that the reaction temperature did not exceed 90°-100° C. over the course of the addition. When the addition was completed the reaction was aged at 95° C. for two hours and then concentrated on a rotary evaporator to remove excess cyclopentadiene monomer. The crude mixture was distilled in vacuo (b.p. 70°-73° C. at 0.2 mm Hg) to yield the purified product (yield 689.7 g, 93% Th.) as a colorless liquid that rapidly solidified at room temperature. High field NMR analysis (300 MHz) indicated that the distillate was a mixture of endo and exo isomers of the desired product and was essentially pure,

EXAMPLE 6

Synthesis of Norborn-5-ene-2-methyl Chloroformate, VI

Norborn-5-ene-2-methanol (196.20 g, 1.58 mol, Aldrich Chemical Co.) was stirred in toluene (250 ml) in a 1000 ml three-necked, round-bottomed flask that was equipped with a magnetic stirrer, a dry ice condenser, a constant pressure addition funnel, and a thermometer. The reaction was carried out under a nitrogen atmosphere and the outlet of the bubble tube was vented into a dilute solution of sodium hydroxide. The solution was cooled to around 10° C. and a solution of phosgene (171.9 g, 1.738 mol) in toluene (250 ml) was added dropwise at such a rate that the reaction temperature did not exceed 25° C. at any time. When the addition was completed the reaction was warmed to room temperature and stirred for sixteen hours. Excess phosgene was removed by a subsurface nitrogen sparge at 30° C. for three hours. Excess solvent was removed on a rotary evaporator and the purified product was obtained by flash vacuum distillation (oil temperature 150° C., b.p. 75°-80° C. at 1.5 mm Hg).

EXAMPLE 7

Synthesis of 1,6-Hexamethylene Di(Norborn-2ene-5-methyl)Carbonate, VII

Norborn-2-ene-5-methanol (314 g, 2.532 mol) and pyridine (217 g, 2.75 mol) were stirred in toluene (600 ml) under a nitrogen atmosphere in a 2000 ml four-necked, round-bottomed flask equipped with an efficient condenser, a thermometer, and a constant pressure addition funnel containing 1,6-hexamethylene bis-chloroformate (300 g, 1.235 mol). The chloroformate was added at such a rate that the reaction temperature did not exceed 80° C. at any time during the addition. When the addition was completed the reaction mixture was aged at 70° C. for three hours then cooled to ambient. The reaction mixture was filtered through Celite TM diatomaceous earth and the filtrate was concentrated on a rotary evaporator. The crude liquid was then passed through a two inch wiped film evaporator (Pope Scientific, Menomonee, Wis.) at 125° C. and 0.5 mm Hg. The yield of viscous oil was 473.1 g.

EXAMPLE 8

Synthesis of 1,6-Hexamethylene Di-(Norborn-2-ene-5-carbamate), VII

Norborn-5-ene-2-methanol (145.04 g, 1.168 mol, Aldrich Chemical Co.) was stirred under a nitrogen atmosphere in toluene (200 ml) with diazabicycloundecane (DBU, 2.0 g) in a 1000 ml four-necked, round-bottomed flask equipped with mechanical stirring, a thermometer, and a constant pressure addition funnel containing hexamethylenediisocyanate (95.34 g, 0.567 mol). The diisocyanate was added dropwise and the reaction temperature was allowed to rise to 70° C. When the addition was completed the reaction mixture was held at this temperature for three hours and the progress of the reaction was monitored by infrared spectroscopy (-NCO band at ca. 2271 cm$^{-1}$). When completed the reaction mixture was cooled and the toluene was removed on a rotary evaporator. The product was recovered as a light yellow syrup which slowly crystallized on standing at room temperature. Yield of the crude product was 238.5 g.

EXAMPLE 9

Synthesis of 1,6-Hexamethylene Di-(Norborn-2-ene-5-carboxamide), IX

Hexamethylenediamine (100 g, 0.861 mol) and pyridine (153.3 g, 1.94 mol) were stirred in toluene (750 ml) under a nitrogen atmosphere in a 2000 ml four-necked, round-bottomed flask equipped with a mechanical stirrer, a thermometer attached to a Thermowatch TM thermostatic controller, and a constant pressure addition funnel. Norborn-2-ene-5 carbonyl chloride (I, 276.09 g, 1.76 mol) was added dropwise at such a rate that the temperature slowly increased to 75° C. over the course of the addition. After the addition was complete, the reaction mixture was stirred for two hours and then methanol (5 g, 0.156 mol) was added to react with any excess acid chloride. Filtration to remove the pyridine hydrochloride salt followed by concentration of the filtrate on a rotary evaporator gave the crude product as a viscous oil that solidified on standing. The yield of crude product was 159.4 g.

EXAMPLE 10

Synthesis of 1,6-Hexanediol Di-(endo,exo-Norborn-2-ene-5-carboxylate) (HDDN), X

Hexanediol diacrylate (6054.5 g, 26.79 mol), was stirred under a nitrogen atmosphere in 12 liter four-necked, round-bottomed flask equipped with mechanical stirring, a constant pressure addition funnel, an efficient condenser and a thermometer connected to a Thermowatch TM temperature controller. Freshly cracked and distilled cyclopentadiene monomer (3541.6 g, 53.58 mol) was added at such a rate that the reaction temperature did not exceed 65° C. at any time during the addition. When the addition was completed the reaction mixture was warmed to 90° C. and aged at this temperature for two hours. Excess cyclopentadiene was removed by vacuum distillation and the crude product was then stripped on a 2 inch wiped film evaporator at 50°-60° C. and 0.2 mm Hg. Yield of the resin was 9331.9 g.

EXAMPLE 11

Synthesis of Bis-2,2-[4-(2-[Norborn-2-ene-5-carboxy]ethoxy)-phenyl]propane, (Ethoxylated Bisphenol A Di-(norborn-2-ene-5-carboxylate), (EBPA DN), XI Ethoxylated bisphenol A diacrylate (700 g, 1.44 mol, 2.88 eq., Sartomer TM 349) was stirred in a 2000 ml, four-necked flask equipped as described above. Cyclopentadiene monomer (198 g, 3.0 mol) was added at such a rate as to keep the reaction temperature at about 90° C. at the end of the addition. The extent of reaction was monitored by HPLC (acetonitrile-water, UV detector 254 nm). When the reaction was complete the reaction mixture was warmed to 120° C. and excess cyclopentadiene monomer and dimer was removed by vacuum concentration. The norbornene functionalized resin was recovered in quantitative yield, NMR spectroscopy was used to determine the absence of acrylic unsaturation and the equivalent weight of the resin (integration of bicyclic unsaturation versus ether methylene groups).

EXAMPLE 12

Synthesis of Trimethylolpropane Tri-(Norborn-2-ene-5-carboxylate) (TMPTN), XII

Trimethylolpropane triacrylate (338 g, 1.0 mol) was stirred under nitrogen in a 1000 ml, four-necked, round-bottomed flask equipped with a Freidrichs condenser, a thermometer, a constant pressure addition funnel, and mechanical stirring at 40° C. Freshly cracked cyclopentadiene monomer (217 g, 3.3 mol) was added at such a rate that the temperature of the reaction slowly climbs to about 90° C. by the end of the addition. The reaction mixture was stirred at this temperature for two hours. The extent of reaction as monitored by the decrease in the infrared absorption band at 1636 cm$^{-1}$. When the reaction was judged to be complete (no change in the infrared absorption), excess cyclopentadiene was removed by vacuum concentration of the resin. The yield of resin is 534 g.

EXAMPLE 13

Synthesis of Pentaerythritol Tetra-(Norborn-2-ene-5-carboxylate) (PETN), XIII

Pentaerythritol tetraacrylate (2500 g, 7.89 mol, 16.59 equivalents of acrylate) was stirred under a nitrogen atmosphere in a 5 liter four-necked, round-bottomed flask equipped with mechanical stirring, a Freidrichs condenser, a constant pressure addition funnel and a thermometer connected to a Thermowatch ® temperature controller. Freshly cracked and distilled cyclopentadiene monomer (1151.38 g, 17.48 mol) was added to the stirred reaction mixture at such a rate that the reaction temperature slowly climbed to 50° C. during the course of the addition. External cooling was necessary at times. When the addition was completed the reaction mixture was stirred at 50° C. for two hours and then excess cyclopentadiene was removed via vacuum distillation. The crude product was then stripped on a 2 inch wiped film evaporator at 50° C. and 0.2 mm Hg. Recovery of the product was quantitative.

EXAMPLE 14

Synthesis of 2,2-bis-[4-(Norborn-2-ene-5-carboxy)cyclohexyl]propane, Hydrogenated Bisphenol A Di-(Norborn-2-ene-5-carboxylate), (HBPA DN), XIV Hydrogenated bisphenol A (441 g, 1.84 mol) was stirred in a 3 liter four-necked, round-bottomed flask equipped with mechanical stirring, a constant pressure addition funnel and a thermometer attached to a Thermowatch TM temperature controller, in dioxane (1750 ml) with triethylamine (394.64 g, 3.90 mol) and 4-dimethylaminopyridine (0.10 g) at 70° C. under a nitrogen atmosphere. Norborn-2-ene-5-carbonyl chloride (I, 581.40 g, 3.71 mol) was added dropwise and the reaction temperature was not allowed to exceed 90° C. at any time. When the addition was completed the reaction mixture was stirred at 90° C. for an additional four hours then cooled to room temperature. Triethylamine hydrochloride was removed via filtration. The filtrate was then diluted with 2000 ml of dichloromethane and washed with 5% aqueous sodium hydroxide solution (2×300 ml), 2M HCl (2×300 ml), and finally deionized water (3×300 ml). The solution was dried over anhydrous sodium sulfate, filtered, and concentrated on a rotary evaporator. The crude product, which was recrystallized from heptane and dried overnight in a vacuum oven, had a melting point of 166°-176° C. Yield of the purified product was 334 g.

EXAMPLE 15

Synthesis of Bis-2,2-[4-(2-[Norborn-2-ene-6-carboxy-5-carboxy]ethoxy)phenyl]propane, XV Ethoxylated bisphenol A (Dianol 22, 158.0 g, 0.50 mol), nadic anhydride (168.9 g, 1.03 mol), pyridine (81.37 g, 1.03 mol) and 4-dimethylaminopyridine (12.2 g, 0.1 mol) were stirred in toluene (600 ml) under a nitrogen atmosphere in a 2000 ml four-necked, round-bottomed flask equipped with mechanical stirring, an efficient condenser, and a thermometer. The reaction mixture was warmed to 70° C. for three hours and then to 100° C. for six hours. The reaction was monitored using infrared spectroscopy (band at 1740 cm$^{-1}$). When the reaction was judged complete, the solution was cooled to room temperature, washed with 3M HCl (1×600 ml) and the organic phase was separated. The solvent was removed on a rotary evaporator and replaced with dichloromethane (600 ml). The solution was then washed with deionized water (5×200 ml) dried over anhydrous sodium sulfate, filtered and then concentrated on a rotary evaporator to give the crude product as a glassy solid. The yield of product was 320 g.

EXAMPLE 16

Synthesis of Poly(tetramethylene oxide 650) Di-(Norborn-5-ene-2-)methyl Carbonate, XVI Hydroxy terminated poly(tetramethylene ether 650) (232.91 g, 0.719 eq. OH) and pyridine (64.3 g, 0.814 mol) was stirred in toluene (300 ml) under a nitrogen atmosphere in a 1000 ml four-necked, round-bottom flask equipped with mechanical stirring, a thermometer and a constant pressure addition funnel containing norborn-5-ene-2-methyl chloroformate (150 g, 0.74 mol). The chloroformate was added dropwise at such a rate that the reaction temperature slowly climbed to 60° C. during the addition. When the addition was completed the reaction mixture was aged at 70° C. for three hours at which point methanol (5.0 g, 0.16 mol) was added to the reaction mixture. The reaction mixture was filtered through Celite TM diatomaceous earth and the filtrate was concentrated on a rotary evaporator to remove solvent. The crude yellow oil was then passed through a two inch wiped film evaporator at 125° C. and 0.3 mm Hg. The yield of product was 328 g.

EXAMPLE 17

Synthesis of Poly(tetramethylene oxide 650) Di-(Norborn-2-ene-5-Carboxylate), XVII Hydroxy terminated poly(tetramethylene oxide 650, PolyTMO) (401.94 g, 1.241 eq. OH, BASF Corporation, Parsippany, N.J.) and pyridine (111.06 g, 1.41 mol) was stirred in toluene (400 ml) under a nitrogen atmosphere in a 2000 ml four-necked, round-bottomed flask equipped with mechanical stirring, a thermometer and a constant pressure addition funnel containing norborn-2-ene-5-carbonyl chloride (200 g, 1.278 mol). The acid chloride was added dropwise at such a rate that the reaction temperature slowly climbed to 70° C. during the addition. When the addition was completed the reaction mixture was aged at 70° C. for three hours at which point methanol (5.0 g, 0.16 mol) was added to the reaction mixture. The reaction mixture was filtered through Celite TM diatomaceous earth and the filtrate was concentrated on a rotary evaporator to remove solvent. The crude oil was then passed through a two inch wiped film evaporator at 125° C. and 0.4 mm Hg. The yield of product was 535 g (96.5% Th.).

EXAMPLE 18

Synthesis of Poly(tetramethylene oxide 650) Di-(Norborn-2-ene-5-Carbamate), XVIII Hydroxy terminated poly(tetramethylene oxide 650) (174.74 g) was stirred under a nitrogen atmosphere with diazabicycloundecane (0.5 g) in a 500 ml four-necked, round-bottomed flask equipped with mechanical stirring, a thermometer, and a constant pressure addition funnel containing norborn-2-ene-5-isocyanate (75 g, 0.556 mol). The addition of isocyanate was controlled at such a rate that the reaction temperature did not exceed 35° C. during the addition period. The reaction mixture was then heated to 70° C. and held at that temperature for six hours. When infrared spectroscopic analysis showed no further change in the NCO band, the reaction mixture was cooled and the crude oil was then passed through a two inch wiped film evaporator at 125° C. and 0.4 mm Hg. The yield of crude oil was 243.3 g.

EXAMPLE 19

Synthesis of Poly(tetramethylene oxide 650) Di-[2-(Norborn-2-ene-5-Carboxamido)-2,2-Dimethylacetate], XIX A mixture of 2-(Norborn-2-ene-5)-4,4-dimethyloxazolin-5-one (130.36 g, 0.636 mol), hydroxy terminated poly(tetramethylene oxide 650) (200 g) and diazabicycloundecane (3.31 g) was stirred under a nitrogen atmosphere in a 1000 ml four-necked, round-bottomed flask equipped with mechanical stirring, and efficient condenser and a thermometer. The reaction mixture was heated to 100° C. After eight hours infrared spectroscopy indicated that the distinctive azlactone carbonyl band at 1817 cm$^{-1}$ had completely disappeared. The crude product was then passed through a two inch wiped film evaporator at 125° C. and 0.4 mm Hg. The yield of viscous oil was 314.8 g.

EXAMPLE 20

Mechanical Properties of Norbornene-Thiol Copolymers

Curable compositions were prepared by mixing equivalent amounts of norbornene functional resins with crosslinking thiols and photoinitiator. Specimens for mechanical testing were cured on a Fusion TM System conveyerized dual lamp system (two H bulbs). Tensile properties were determined on an Instron TM Universal Testing Machine Model 4505 using 20 mil films according to a modified ASTM D-883 test. Dynamic mechanical tests were carried out on a Rheometrics Dynamic Analyzer RDA II with torsion rectangular geometry. Strain and frequency sweeps were carried out on duplicate samples to insure that temperature sweeps were carried out in the linear response region.

Mechanical and dynamic mechanical characterization of these resins has first focussed on studying the properties of thin films produced from the copolymerization of PETMP with the norbornene functional monomers. The thin films were studied as single component mixtures of the norbornene resins and crosslinking thiol (PETMP, held constant throughout the study) to characterize the behavior of different functional groups (ester, versus amide, urethane, etc.) as well as the influence of the level of functionality (f) in the norbornene resin (f=2, versus 3, 4, etc.). The properties of cured films of these materials are given in Table I.

Tg appears to correlate well with functionality while the correlation of tensile moduli is somewhat sporadic. The highest Tg was obtained for a film of resin XIII, (tetrafunctional pentaerythritol norbornene ester). However, this material was not as stiff as films prepared from some di- and tri-functional resins. For example, a crosslinked film of PETMP and resin XII, which is trifunctional, had the highest tensile moduli and the second-highest Tg.

The interrelation of functional group structure and properties is shown by the results for the film containing resin IX (a difunctional norbornene amide). Here, it is assumed that restricted rotation around the amide linkage and hydrogen bonding between amides contribute to the high tensile modulus and tensile strength, as well as Tg.

This point is further illustrated by comparison of the rigid, hydrgenbonding $C_6$ amide resin with systems having similar crosslink density where all bonding is assumed to be covalent and contributions by more rigid resonance structures can be neglected (the $C_6$ ester or $C_6$ carbonate). The ester and carbonate are softer materials because their molecular structures do not incorporate stiffening units into the backbone. The resulting cured films exhibit much lower moduli and have high elongation to break.

TABLE 1

Tensile Properties and Glass Transition Temperatures for Films Containing a Single Norbornene Resin

| N-Resin w/PETMP | Tensile Modulus, MPa | Tensile Strength, MPa | Elongation at Break, % | Tg °C. |
|---|---|---|---|---|
| XI (Aromatic ester f = 2) | 1900 ± 300 | 40.0 ± 5.1 | 2.9 ± 0.5 | 36.4 |
| XII (Alkyl ester f = 3) | 2300 ± 50 | 61.0 ± 3.3 | 4.1 ± 0.6 | 67.5 |
| XIII (Alkyl ester f = 4) | 1550 ± 180 | 47.2 ± 6.0 | 4.9 ± 0.5 | 71.5 |
| X ($C_6$ Ester f = 2) | 810 ± 200 | 17.0 ± 1.5 | 105 ± 12 | 30.1 |
| IX ($C_6$ Amide f = 2) | 1720 ± 144 | 52.7 ± 1.9 | 4.15 ± 0.45 | 62.1 |
| VIII ($C_6$ Urethane f = 2) | 504 ± 72 | 15.3 ± 3.9 | 212 ± 16 | 36 |
| VII ($C_6$ Carbonate f = 2) | 127.8 ± 3.2 | 8.1 ± 1.3 | 106.0 ± 8.8 | NA |
| III (Alkyl ester f = 2) | 2115 ± 53 | 36.0 ± 7.64 | 6.18 ± 2.08 | 45 |

EXAMPLE 21

Properties of Mixed Nene Resins

This example illustrates the effects of mixing norbornene monomers. The behavior of multi-component mixtures is of interest because several of the norbornene monomers were attractive as reactive diluents for the higher molecular weight oligomeric species. Two component mixtures with increasing levels of functionality were also studied.

Four two-component blends were studied using 1:1 (w:w) mixtures of the resins. Three mixtures contained combinations of the X, XI and XII resins. A blend of III with XIV was also studied to evaluate the usefulness of III as a reactive diluent-solvent for the highly crystalline XIV. Cured films were prepared from these formulations and a stoichiometric equivalent of PETMP. Table II shows the properties of these cured materials.

TABLE II

Tensile Properties and Glass Transition Temperatures of Blended Norbornene Resin-PETMP Cured Films

| N-Resin (w PETMP) | Tensile Modulus MPa | Tensile Strength MPa | Elongation at Break, % | Tg °C. |
|---|---|---|---|---|
| X:XII (1:1) | 1700 ± 40 | 44 ± 2.3 | 3.4 ± 0.4 | 46.9 |
| X:XI (1:1) | 2000 ± 50 | 39 ± 4.1 | 2.8 ± 0.4 | 35.9 |
| XI:XII (1:1) | 2600 ± 300 | 44 ± 16 | 2.2 ± 0.9 | 52.7 |
| III:XIV (1:1) | 2030 ± 74 | 55 ± 2 | 4.5 ± 0.3 | 64.3 |

These results show that blending X and XII produces a material with tensile properties which are close to the arithmetic average of the individual homopolymers. However, elongation to break is essentially that of the single XII resin film (4.1% vs. >100%). This is observed in both mixtures containing X.

Modification of properties was also noted in the mixture containing III and XIV. The film made from the pure XIV resin was so brittle that extensive cracking and shattering made it difficult to obtain test specimens. Blending with III did not produce a material with significantly different tensile properties from the other blends tested. However, an increase in elongation to break was noted for the mixture over the single component film of XIV. This result indicates blends incorporating III is useful for improving elongation in brittle systems. Alternatively, the tensile results indicate that small amounts of XIV could be used to increase the stiffness and decrease the elongation of softer, more elastomeric materials.

All norbornene blends studied were miscible at room temperature in the proportions studied. As temperature sweeps of the cured films obtained by dynamic mechanical analysis showed a single Tg for each blend, the oligomers were considered to be miscible and to have formed a random copolymer. In addition, all films were optically clear, another indication of miscibility.

Further mixture work focused on the effect of increasing the level of ene functionality on the glass transition and the mechanical properties. A simple mixture of a difunctional ene, XI (EBPA DN), and a trifunctional ene, XII (TMP TN), was studied. These two ene components and the crosslinker would be expected to form a random copolymer mixture. The results are listed below in Table III.

TABLE III

Effects of Mixture Composition on Mechanical Properties For Blends of Norbornene Resins XI and XII Crosslinked with PETMP

| Resin* (w/w) | Modulus (MPa) | Tensile Strength (MPa) | Elongation (%) | Tg (°C.) |
|---|---|---|---|---|
| XI (EBPA DN) | 1434 | 30.35 | 3.83 | 38 |
| XI:XII (39:1) | 1500 | 33.10 | 4.04 | 39 |
| XI:XII (19:1) | 1603 | 33.58 | 3.85 | 41 |
| XI:XII (9:1) | 1603 | 42.60 | 3.88 | 42 |
| XI:XII (1:1) | 2600 | 44 | 2.20 | 52 |
| XII (TMPTN) | 2300 | 61 | 4.10 | 67 |

These results indicate that this mixture of ene components show a good correspondence with the relationship predicted from the so-called *Rule of Mixtures* which predicts the glass transition for random copolymers. Therefore complete mixing can be assumed.

EXAMPLE 22

Backbone Effects

The effect of various end groups on a single oligomeric backbone (poly[TMO 650]) was also investigated. Table IV outlines the mechanical properties and glass transition temperatures of these materials. It is seen that in poly(TMO 650) based systems, the identity of the endgroups does not wield significant influence on final mechanical and thermal properties. Rather, the flexibility of the Poly(TMO) 650 backbone exerts the major influence on the properties of the cured film regardless of the end group and produces a material which is rubbery at room temperature. When a long backbone is not built into the starting oligomer, endgroup functionality has a much greater influence on Tg and tensile properties. This is illustrated by comparing the properties of IX (the $C_6$ amide) with those of XIX (the poly[TMO 650] amide). Hydrogen bonding between amide groups is possible in both systems. Tg varies by approximately 100° C. Tensile moduli differ by a factor of 1000; tensile strength of these two films differ by a factor of 100.

TABLE IV

Tensile Properties and Glass Transition Temperatures of Various Norbornene-Functionalized Poly(TMO 650) Resin

| N-Functionality (w PETMP) | Tensile Modulus (MPa) | Tensile Strength (MPa) | Elongation at Break (%) | Tg (°C.) |
|---|---|---|---|---|
| XVI (Norbornene-methyl Carbonate Ester) | 4.70 ± 0.23 | 0.69 ± 0.05 | 17.3 ± 2.0 | −39.0 |
| XVII (Norbornene Ester) | 5.62 ± 1.03 | 0.81 ± 0.11 | 16.7 | −39.0 |
| XVIII (Norbornene Urethane) | 5.86 ± 0.28 | 1.17 ± 0.25 | 25.0 ± 6.6 | −16.0 |
| XIX (Norbornene-amido Dimethylacetate) | 1.38 ± 0.28 | 0.53 ± 0.06 | 51.5 ± 7.7 | −20.0 |

The structure of VII (the $C_6$ carbonate ester) is, except for backbone length, similar to that of XVI (the poly(TMO 650) carbonate); although VII was soft and somewhat difficult to handle at room temperature, its tensile properties are an order of magnitude greater than the cured film containing oligomer XVI.

Finally, the effect of polar functional groups on Tg in the same oligomeric series is reinforced. Comparison of Tg values for XIX (amide functional) and XVIII (urethane functionality) with XVI (carbonate ester) and XVII (carboxylate ester) show stiffening due to restricted rotation of the amide and urethane groups and hydrogen bond formation. The Tg values for the former materials exceed the latter by approximately 20°-25° C. Clearly, the type of functionality in the end groups exerts an influence on the physical and mechanical properties of films in a homologous series. This effect can be magnified or attenuated by the backbone.

EXAMPLE 23

Photopolymerization Studies

To study the photoresponse of the norbornene resins a UV cure study was designed. The method used FT-IR analysis of the samples at various UV doses to determine the effect of functionality on conversion. Samples studies were mixtures of equivalent amounts of norbornene resin with pentaerythritol tetramercaptopropionate (PETMP). A standard acrylate monomer, ethoxylated bisphenol A diacrylate was also studied (without polythiol), but at a higher dose (13.3 vs. 2.13 mJ-cm$^{-2}$). At the lower dosage level, the acrylate was unreactive due to oxygen inhibition. Even this higher dose rate is probably not sufficient to completely overcome the effect of oxygen inhibition and this is also apparent in the high UV dose required to reach the ultimate conversion level of 65%. When the norbornene systems were subjected to the higher dose rate, the polymerization was too fast to make measurements at the intermediate stages. Results are given in Table V below.

TABLE V

Conversion and UV Dose Parameters

| | Fractional Conversion | Total Dose (mJ-cm$^{-2}$) | Dose to 50% (mJ-cm$^{-2}$) | UV Intensity (mW-cm$^{-2}$) |
|---|---|---|---|---|
| N-Resin (w PETMP) | | | | |
| Ethoxylated bisphenol A Di-(N-carboxylate) (EBPA DN) | 0.65 | 600 | 65 | 2.13 |
| 1,6-Hexanediol Di-(N-carboxylate) (HDDN) | 0.76 | 380 | 30 | 2.13 |
| Trimethylolpropane Tri-(N-carboxylate) (TMP TN) | 0.60 | 300 | 85 | 2.13 |
| Pentaerythritol Tetra-(N-carboxylate) (PETN)) | 0.49 | 520 | 390 | 2.13 |
| Comparative Resin | | | | |
| Ethoxylated bisphenol A Diacrylate | 0.65 | 8000 | 2800 | 13.3 |

EXAMPLE 24

Stereolithography Testing

Two resin formulations were prepared as follows:

| | Formulation A | Formulation B |
|---|---|---|
| TMP-TN[1] | 60 | — |
| HDDN[2] | 60 | 200 |
| PETMP[3] | 85.3 | 135.7 |
| Photoinitiator[4] | 4.19 | 6.85 |
| Stabilizer[5] | 1000 ppm | 1000 ppm |

[1]Trimethylolpropane trinorbornenecarboxylate
[2]Hexanediol dinorbornenecarboxylate
[3]Pentaerythritol tetramercaptopropionate
[4]Darocur TM 1173
[5]Aluminum salt of N-nitrosophenylhydroxylamine, sold by Wako Chemicals GmbH, Fed. Rep. of Germany.

A 3D Systems Inc. SLA 250 machine employing a He-Cd laser at approximately 8 mW was used to build four sets of five railroad ties per a standard 3D Systems quality control procedure. Exposures were varied as each tie was built and the thickness of the resulting tie measured to produce a dosage/responsive curve. At depths greater than about 40 mils the tie shape was smeared as cure extended beyond the edges of the laser beam at the surface of the resin. This problem was not observed below about 40 mils.

Figure 2:
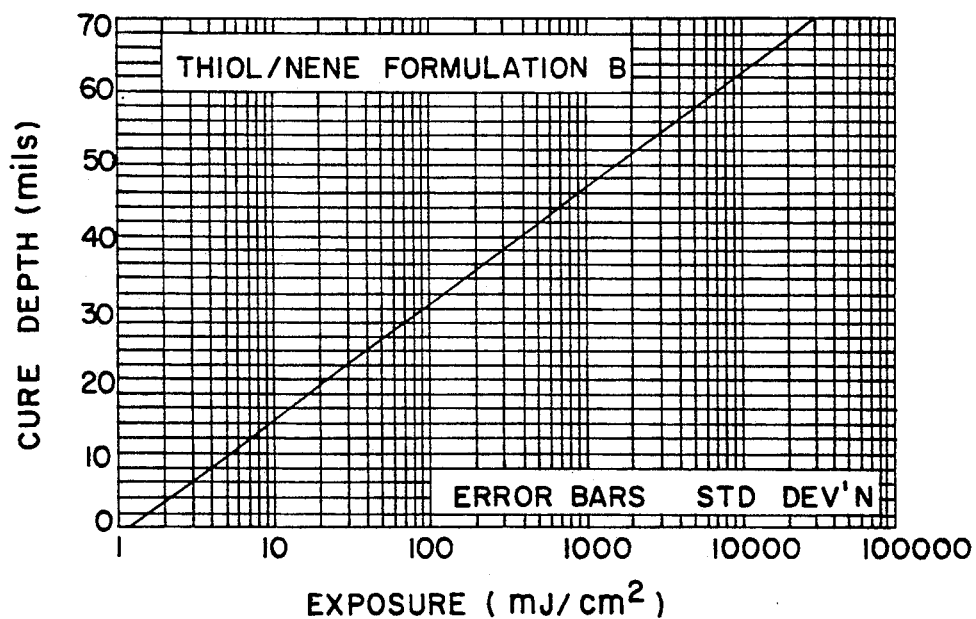

FIGS. 1 and 2 are UV response curves produced from the railroad tie measurements for resins A and B respectively. As can be seen from these figures, UV response is very rapid. For instance, at 20 mil cure depth, exposure (mJ/cm$^2$) for formulation A was about 50 and for formulation B about 23. This compares very favorably with the results reported for acrylic resin in Murphy et al "Reduced Distortion in Optical Free Form Fabrication with UV Lasers", Radiation Curing, Feb.-May 1989, pp. 3-7, wherein a similar procedure reportedly required between about 1.5 and 5 joules/cm$^2$ to cure to a 20 mil depth.

"Green" 20 mil single layer pull bars were formed by laser curing in a 3D Systems Inc. stereolithography apparatus. Tensile strength, modulus and elongation to break were determined on the "green" samples. Similarly prepared pull bars were subjected to post-curing with UV flood lamps in a 3D Systems Inc. post-curing apparatus. Table VI reports average values obtained with nene/thiol formulations A and B, as well as reported values for a prior art acrylic based stereolithography resin, Ciba-Geigy Cibatool XL SB 5081.

TABLE VI

| | Modulus (N/mm$^2$) | Tensile Strength (N/mm$^2$) | Elongation (%) |
|---|---|---|---|
| RESIN A | | | |
| Green | 65 | 4 | ~100 |
| Post cured | 423 | 23 | 13 |
| RESIN B | | | |
| Green | 106 | 4.4 | 91 |
| Post cured | 523 | 50 | 12 |
| CIBATOOL 5081 | | | |
| Green | 80-100 | 5-10 | 5-10 |
| Post cured | 2500-3500 | 50-70 | 2-3 |

As can be seen from this data, both thiol/nene formulations produce much less brittle products than the prior art acrylic formulation while retaining acceptable tensile strength properties.

What is claimed is:

1. In a stereolithography method for building a three-dimensional article comprising the steps of patternwise curing successive layers of a bath of curable liquid resin formulation until the article has been completely built up, removing the article from the liquid resin bath and then post-curing the article, the improvement wherein the liquid resin is a thiol/nene formulation comprising:
   (a) a first compound having a plurality of norbornene groups thereon;
   (b) a second compound having a plurality of thiol groups therein; and
   (c) a free radical photoinitiator,
the total functionality of the formulation being greater than 4.

2. A method as in claim 1 wherein said first compound is a norbornene carboxylate polyol ester.

3. A method as in claim 2 wherein said first compound is a norbornene carboxylate ester of trimethylolpropane, hexanediol, ethoxylated bisphenol A or mixtures thereof.

4. A method as in claim 2 wherein said second compound is a α- or β-mercaptocarboxylate polyol ester.

5. A method as in claim 4 wherein said second compound is an α- or β-mercaptopropionate ester of tri or higher functional alcohol.

6. A method as in claim 5 wherein said second compound is pentaerythritol tetrakis β-mercaptopropionate.

7. A method as in claim 1 wherein the thickness of each said layer is less than 40 mils.

8. A method as in claim 7 wherein the said layer thickness is about 20 mils or less.

9. A method as in claim 7 wherein said patternwise curing is accomplished by successively tracing sectional images of said article onto the surface of the liquid resin with a UV laser bath to provide a cured sectional layer of said article on said bath surface and incrementally lowering the article one layer depth below the surface of the bath after each layer is cured until the entire article has been built up.

10. A method as in claim 1 wherein the thiol/nene formulation further comprises a shelf-life stabilizing effective amount of a polyiodide.

11. A method as in claim 10 wherein the polyiodide stabilizer is KI/I$_2$ in an approximate weight ratio of 1:2 and is present at a level of about 10-2,000 ppm I$_2$.

* * * * *

UNITED STATES PATENT AND TRADEMARK OFFICE
CERTIFICATE OF CORRECTION

PATENT NO.  : 5,167,882
DATED       : December 1, 1992
INVENTOR(S) : Anthony F. Jacobine et al It is certified that error appears in the above-indentified patent and that said Letters Patent is hereby corrected as shown below:

Column 4, lines 41-42 thereof, delete "Synthesis of endo, exo-Norborn-2-ene-5-carbonyl Chloride, II" and subsitute--Synthesis of endo, exo-Norborn-2-ene-6-methyl-5-carbonyl Chloride, II--therefor.

Column 5, lines 36-38 thereof, delete "Synthesis of endo, exo-2-(Norborn-5-ene-5)-4,4 dimethyloxazoline-5-one Norbornene Azlactone (NAz), V--therefor exo-2-(Norborn-5-ene-2-yl)-4,4 dimethyloxazoline-5-one Norbornene Azlactone (NAz), v --therefor.

Column 5, line 65 thereof, delete "Norborn-5-ene-2-methanol" and substitute -- Norborn-5-ene-2-methylol -- therefor.

Column 6, line 41 thereof, delete "Di-(Norborn-2-ene-5-carbamate). VII" and substitute -- Di-(Norborn-2-ene-5-methylene-carbamate), VII -- therefor.

Signed and Sealed this

Thirteenth Day of September, 1994

Attest:

BRUCE LEHMAN

Attesting Officer              Commissioner of Patents and Trademarks